United States Patent
Tiittanen et al.

(10) Patent No.: US 9,374,034 B2
(45) Date of Patent: Jun. 21, 2016

(54) METHOD AND AN ARRANGEMENT IN CONNECTION WITH A SOLAR ENERGY SYSTEM

(71) Applicant: ABB OY, Helsinki (FI)

(72) Inventors: Jukka Tiittanen, Veikkola (FI); Vesa Koistinen, Riihimäki (FI); Timo Koivuluoma, Vantaa (FI)

(73) Assignee: ABB Technology AG, Zurich (CH)

( * ) Notice: Subject to any disclaimer, the term of this patent is extended or adjusted under 35 U.S.C. 154(b) by 0 days.

(21) Appl. No.: 14/564,376

(22) Filed: Dec. 9, 2014

(65) Prior Publication Data

US 2015/0091381 A1  Apr. 2, 2015

Related U.S. Application Data

(62) Division of application No. 13/350,219, filed on Jan. 13, 2012, now abandoned.

(30) Foreign Application Priority Data

Jan. 31, 2011 (EP) ..................... 11152686

(51) Int. Cl.
*H02N 6/00* (2006.01)
*H01L 31/042* (2014.01)
(Continued)

(52) U.S. Cl.
CPC .......... *H02S 40/40* (2014.12); *H01L 31/02021* (2013.01); *H02S 40/00* (2013.01); *H02S 40/32* (2014.12); *H02J 3/383* (2013.01); *Y02E 10/563* (2013.01); *Y10T 307/50* (2015.04)

(58) Field of Classification Search
CPC ......... H02S 40/00; H02S 40/30; H02S 40/32; H02S 40/40; H02S 40/44; H02S 40/34; H02S 40/345; H02S 40/425; H01L 31/02002; H01L 31/02021; H01L 31/02016; H01L 31/0203; H01L 31/04; H01L 31/042; H01L 31/052; H01L 31/0525

See application file for complete search history.

(56) References Cited

U.S. PATENT DOCUMENTS

2002/0179138 A1\* 12/2002 Lawheed ................. F24J 2/085
136/246
2008/0022683 A1  1/2008 Ohler et al.
(Continued)

FOREIGN PATENT DOCUMENTS

CN  87 2 15415 U   9/1988
CN  2847649 Y  12/2006
(Continued)

OTHER PUBLICATIONS

European Search Report issued on Jul. 4, 2011.
(Continued)

*Primary Examiner* — Eli Mekhlin
(74) *Attorney, Agent, or Firm* — Taft Stettinius & Hollister LLP

(57) ABSTRACT

An arrangement and a method are provided in connection with a solar energy system. The arrangement includes solar panels and a converter for converting the DC voltage from the solar panels. The converter is arranged inside a container or a similar closed structure. The arrangement includes means for producing heat from the energy produced by the solar panels. The means are arranged inside the container or a similar closed structure and are electrically connectable to the solar panels.

19 Claims, 1 Drawing Sheet

(51) Int. Cl.
  *H02S 40/40* (2014.01)
  *H01L 31/02* (2006.01)
  *H02S 40/32* (2014.01)
  *H02J 3/38* (2006.01)

(56) References Cited

U.S. PATENT DOCUMENTS

| | | |
|---|---|---|
| 2010/0132707 A1 | 6/2010 | Muller |
| 2010/0134959 A1 | 6/2010 | Fife et al. |
| 2010/0139736 A1* | 6/2010 | Teichmann ............... F24J 3/08 136/246 |
| 2010/0275968 A1 | 11/2010 | Kaiser et al. |
| 2011/0005580 A1 | 1/2011 | Vandermeulen |

FOREIGN PATENT DOCUMENTS

| | | |
|---|---|---|
| CN | 201134615 Y | 10/2008 |
| WO | WO 2005/088122 A1 | 9/2005 |

OTHER PUBLICATIONS

Office Action (Notification of the First Office Action) issued on Jan. 2, 2014, by the State Intellectual Property Office of People's Republic of China in corresponding Chinese Patent Application No. 201210014831.5, and an English Translation of the Office Action. (14 pages).

Kaundinya et al., Renewable and Sustainable Energy Reviews, 13 (2009) 2041-2050.

* cited by examiner

METHOD AND AN ARRANGEMENT IN CONNECTION WITH A SOLAR ENERGY SYSTEM

RELATED APPLICATION

This application is a divisional application which claims priority to U.S. application Ser. No. 13/350,219, filed Jan. 13, 2012, now abandoned, which claims priority under 35 U.S.C. §119 to European Patent Application No. 11152686.9 filed in Europe on Jan. 31, 2011, the entire content of which is hereby incorporated by reference in their entirety.

FIELD

The present disclosure relates to a converter arrangement in a container structure containing at least part of the electrical components of the converter, and more particularly to a container structure in which the indoor climate is controlled.

BACKGROUND INFORMATION

Converters are used in many applications for converting electrical energy from one form to another. Converters are used, for example, in connection with solar power. In solar power applications, the converter receives DC voltage from the photovoltaic panels and generally converts it to AC voltage. AC voltage is further fed to the network. In solar power applications, the converter used for converting the voltage is also called a solar inverter.

Converters or inverters utilized in solar and wind power applications are generally placed in containers or similar simple enclosures. These containers are then placed near the actual power generation points. These containers are thus outside in fields or open places which are suitable for the generation of power. The containers or enclosures and the electric components inside the enclosures are cooled using heat exchangers or are cooled directly with air from outside the enclosure.

A solar inverter operates cyclically for natural reasons. In daytime, the inverter is in operation feeding power to the grid. When the sun sets or when the solar panels are not able to generate enough power, the inverter is switched off completely.

The cyclical operation of the inverter causes problems relating to the temperature and humidity inside the enclosure. The temperature inside the enclosure varies considerably and the repeated changes in the temperature cause the semiconductor components to wear out prematurely. Further, the humidity inside the container may cause short circuits. The condensed water may also freeze inside the container, which may block the operation of the converter completely.

It is known to use electric heating to keep the container air dry and warm enough for safe start of the operation. Electricity for such heating is obtained from a separate source of electricity, for example, directly from the mains, when the temperature and/or humidity of the inside air moves to a critical area.

Due to the outside temperature changes, the temperature inside the container varies and the semiconductor lifetime gets shorter due to the temperature cycling.

If the inside air contains humidity, it may condensate without control in the wrong place. Since containers or similar structures enclosing the converter are not airtight, wet air passes easily inside the containers, and the condensed water causes problems which may lead to total breakage of the system.

In very harsh conditions, the temperature inside the container may get considerably below zero degrees Celsius. Normal electronic components are not specified in temperatures which are near −20° C. It is possible that the equipment does not start, or it may get damaged due to the temperature. In such a case, heating is required inside the container for keeping the temperature in allowed limits.

SUMMARY

An exemplary embodiment of the present disclosure provides an arrangement in connection with a solar energy system. The exemplary arrangement includes solar panels, a converter for converting DC voltage from the solar panels, and a container having the converter arranged therein. The exemplary arrangement also includes means for producing heat from the energy produced by the solar panels, where the means for producing heat are arranged inside the container are electrically connectable to the solar panels.

An exemplary embodiment of the present disclosure provides a method in connection with a solar energy system which includes solar panels and a converter for converting the DC voltage from the solar panels. The converter is arranged inside a container. The exemplary method includes producing heat with a device for producing heat from the energy produced by the solar panels. The device for producing the heat from the energy produced by the solar panels is arranged inside the container and is electrically connectable to the solar panels.

BRIEF DESCRIPTION OF THE DRAWINGS

Additional refinements, advantages and features of the present disclosure are described in more detail below with reference to exemplary embodiments illustrated in the drawings, in which.

DETAILED DESCRIPTION

Exemplary embodiments of the present disclosure provide a method and an arrangement for implementing the method which overcome the problems associated with conventional techniques as discussed above. Exemplary embodiments provide a method and arrangement in connection with a solar energy system including solar panels and a converter for converting the DC voltage from the solar panels. The converter is arranged inside a contained or a similar closed structure. In accordance with an exemplary embodiment, the arrangement includes means for producing heat from the energy produced by the solar panels. In accordance with an exemplary embodiment, the method includes producing heat with means for producing heat from the energy produced by the solar panels. The means for producing heat are arranged inside the container or a similar closed structure and are electrically connectable to the solar panels.

Exemplary embodiments of the present disclosure are based on the idea of using the energy provided by the solar panels in heating the apparatus(es) inside the container. When the power output from the solar panels is not enough for producing power to the grid, the power is used to warm the container.

The additional heating obtained with the present disclosure can be used to heat either the air inside the container or some heat storing masses inside the container.

According to the method and arrangement of the present disclosure, the temperature cycling can be minimized with a very cost effective solution. Due to reduced temperature cycling, the semiconductor component in the converter structure lasts longer. Further, since the temperature can be kept at a higher level, the problem relating to humidity is greatly alleviated.

Figure 1:
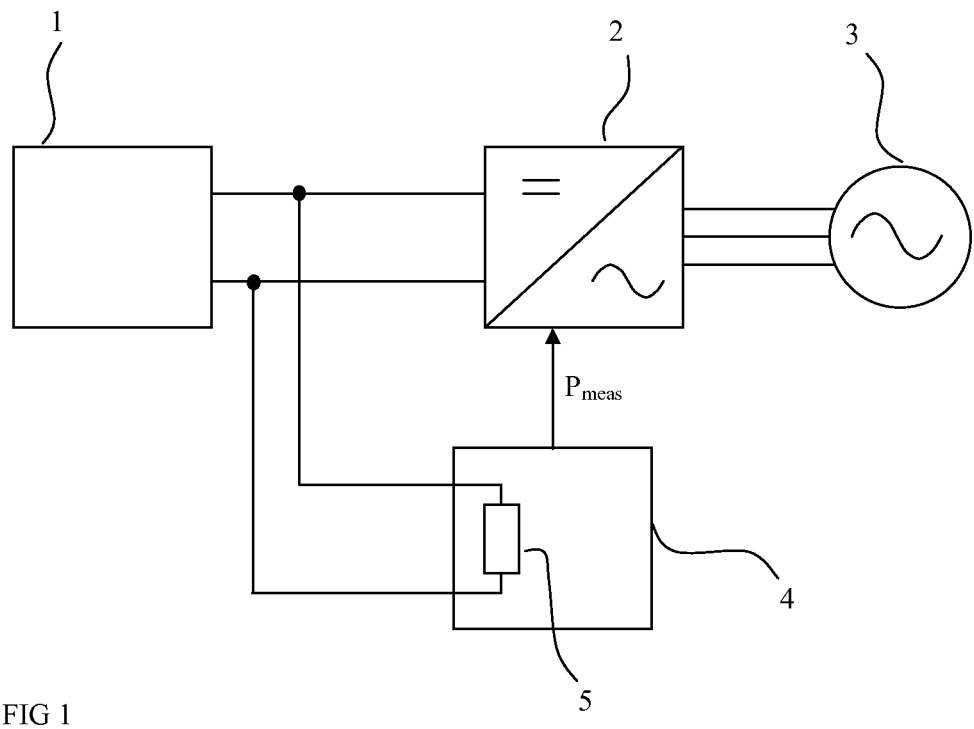
FIG. 1 shows a simplified block diagram of an exemplary embodiment of the disclosure.

FIG. 1 is shows a simplified block diagram of a photovoltaic power generation system. A photovoltaic panel or string or array of such panels 1 produce DC voltage to a converter 2. In accordance with an exemplary embodiment, the converter 2 can be an inverter, possibly having multiple converting stages, and in connection with solar power the converter 2 is often called a solar inverter. The purpose of this converter 2 is to produce AC voltage from the DC voltage obtainable from the solar panel 1. The AC voltage is produced such that its phase and frequency are synchronized with the voltage of the supplied network 3.

It is known that when the power output from the solar panels 1 has decreased to a level at which power cannot be fed to the network 3, the converter 2 is completely shut down. The reason for the complete shut-down is the losses of the converter 2 itself. The losses may be, for example, 1% of the rated power of the converter 2. In a converter 2 with rated power of 1 MW, the losses are in the range of 10 KW, for example. Since the solar system does not produce energy, this energy would be supplied to the converter 2 from the network. In case the power produced with the solar panels 1 is lower than the losses in the converter 2, the operation of the converter 2 is not possible without any additional power source. The losses of the converter system include losses of the blowers, discharge capacitors and circuit boards, the switching losses of the semiconductor switches, etc.

When the sun sets or rises, light is scattered for a substantially long period of time. The solar panels 1 generate voltage, although this voltage is not sufficient for feeding power to the grid. In accordance with an exemplary embodiment of the present disclosure, when the solar panels 1 generate power and the power is not fed to the grid, this power is used to heat the container in which the converter 2 is located. In accordance with an exemplary embodiment, the heating may be carried out with resistive elements in which electrical energy is converted to heat. Resistive elements are, for example, resistors that are designed to be used in heating.

Once it is noticed that the generated power is sufficient for feeding it through the converter 2 to the grid 3, the converter is taken into use. For example, during the sunrise, the obtainable power gradually increases. The point where the converter 2 having been shut down is taken into use can be determined based on the voltage generated by the panels 1. However, if the open circuit voltage of the panels 1 is measured to determine whether solar panels generate enough power, erroneous switchings are likely to be made. This is due to the fact that once the panels 1 are loaded, the voltage may decrease dramatically if the required level of power is not reached. The erroneous switchings of the converter 2 to and from the grid 3 wear the components.

According to an exemplary embodiment of the present disclosure, the power generated by the panels 1 of the arrangement is measured. In FIG. 1, block 4 contains a resistive element and a means for measuring the power. The measurement can be carried out because the panels are actually loaded with the resistive elements that are used for heating the container. The measured power is used to determine if the power level is sufficient for feeding power through the converter 2 to the grid 3. It is shown in the example of FIG. 1 how the block 4 outputs a signal $P_{meas}$ to the converter 2. On the basis of the signal, the converter 2 is started.

In accordance with an exemplary embodiment, the measured power can be an average value of the power or a filtered value which takes into account the variations of the obtained power due to the possible cloudiness. That is to say that the converter 2 is not necessarily started when the measured power exceeds the required limit. Instead, the operation of the converter 2 is started once the average of the power is at a suitable level. The averaging or filtering of the power can be carried out by integrating the power and it gives the trend of generation of the power. It is clear that when the sky is cloudy or half-cloudy, the power obtained with the panel 1 changes considerably and the measurement of instantaneous power can lead to too early switching of the converter 2.

The measurement of the power from the panels 1 helps in maximizing the power output from the panels 1 because the timing of the start can be determined substantially accurately. Further, since the panels are loaded when the operation of the converter 2 is started, the embodiment allows panels 1 to be used with higher open-circuit voltage without the risk of damaging the converter 2 and/or other components. The loading of the panels 1 enables the open-circuit voltage to be decreased by loading the panels 1 prior to connection to the DC-intermediate circuit of the converter 2 and/or start of the feeding of the power to the grid 2.

According to an exemplary embodiment of the present disclosure, the arrangement includes at least two resistors for loading the solar panels 1 and for generating heat. The resistors are arranged such that one of the resistors heats the air in the container in which the converter 2 is situated while the other resistor is arranged to heat some thermal mass which is able to store the heat. In accordance with an exemplary embodiment, the resistor to be used may be selectable. It may be advisable to use the resistor in such a way that in the mornings when the sun is rising, the power generated by the solar panels 1 is used to heat the inside air of the container. During the night, the temperatures tend to fall and some humidity may be condensed in the apparatuses inside the container. By using the scattered light for generating power for the heater, the inside temperature can be increased such that the converter 2 can be started in a safer manner.

For the safe start of the converter 2, the scattered light can also be used for heating the critical devices directly. These critical devices can include, for example, circuit boards, power semiconductor switches and similar components. In case the converter 2 is a liquid-cooled system, the liquid can also be heated with the scattered sunlight. The heated liquid heats the devices that are normally cooled with the liquid.

In accordance with an exemplary embodiment, when the sun is setting and the converter can no longer produce electricity to the grid 3, the power from the solar panels 1 can be led to a resistive element that is arranged to heat a thermal mass. When the converter has been in operation, the temperature inside the container is high due to losses of the converter 2. However, as the sun is setting, the temperature tends to decrease. It is therefore advisable to store the energy that can be obtained from the solar panels 1 as heat, so that the thermal mass releases heat during the time when the outside temperature is low.

The thermal mass used may be any particle or fluid which has suitable thermal properties. One possibility is to use phase change materials (PCM). The phase change material is added to act as a thermal mass that is heated to an elevated temperature. Each PCM material has a certain phase change temperature. When this temperature is reached, the material starts changing its phase, keeping the temperature at the same level. Such a material can be used to keep the temperature inside the container at an elevated temperature. If desired, a controlled blower may be added in connection with the thermal mass. The blower may be controlled in such a way that when the temperature decreases to a set level, the blower is taken into use. The blower increases the transfer of heat from the thermal mass such that the heat is exchanged more rapidly from the mass to the air inside the container. The temperature level in which the blower is taken into operation may be the outside temperature, inside temperature or the temperature difference between the temperatures. Air humidity may also be used as the limit separately or together with the temperatures. One possible limit would be to keep the temperature inside the container 10° C. higher than the outside temperature, so that the relative humidity would stay under 60%.

If the stored heat is not enough to keep the temperature and/or humidity inside the container in desired limits, auxiliary power sources may also be used for heating. If, for example, electrical heaters are required, the energy taken by them is considerably lower than without the thermal masses. The auxiliary power sources are taken into use after the temperature has dropped below the limit, such that the heat from the thermal mass is used first. If this heat is not enough, then the auxiliary power sources are taken into use.

Since two different resistive elements are used according to the above-described exemplary embodiment, the arrangement can include a change-over switch or similar means which can be used to select the resistive element used. The operation of the change-over switch can be based on a clock such that in the hours after noon, the energy from the panels is fed to the resistive element heating the thermal mass, and before noon to the resistive element heating the air inside the container. Other logics may also be applied.

According to an exemplary embodiment of the present disclosure, the resistive element heats both the air inside the container and the thermal mass. In this embodiment, part of the power is thus used for heating the mass and part is used for heating the air. In this way, there is no need for change-over switches and associated logics. When both resistive elements are in operation at the same time, the operation may not be as effective as with resistors used separately.

In the above-described exemplary embodiments, the means for producing heat are operated only when the converter is not operating. According to an exemplary embodiment of the present disclosure, in case the power output from the solar panels 1 exceeds the power rating of the converter 2, the excessive power is used for heating thermal mass inside the container. The fact that the power rating is exceeded can be noticed with current measurements in the converter 2. With this embodiment of the present disclosure, all the energy from the solar panels 1 can be gathered.

Alternatively or together with the heating of the thermal mass, when the power output from the solar panels 1 exceeds the power rating of the converter, the excessive power is used in drying the air inside the container. The air can be dried by using Peltier elements, for example.

In conditions where the container needs cooling, the excessive power from the solar panels 1 can be led to a cooling arrangement. This cooling arrangement may include an air source heat pump or air conditioner, which is fed by the excessive power. The cooling arrangement can also include a converter for converting the power to a suitable form for the heat pump or air conditioner. If the heat pump or air conditioner is operable with DC power obtained from the panels 1, converters are not required.

Figure 2:
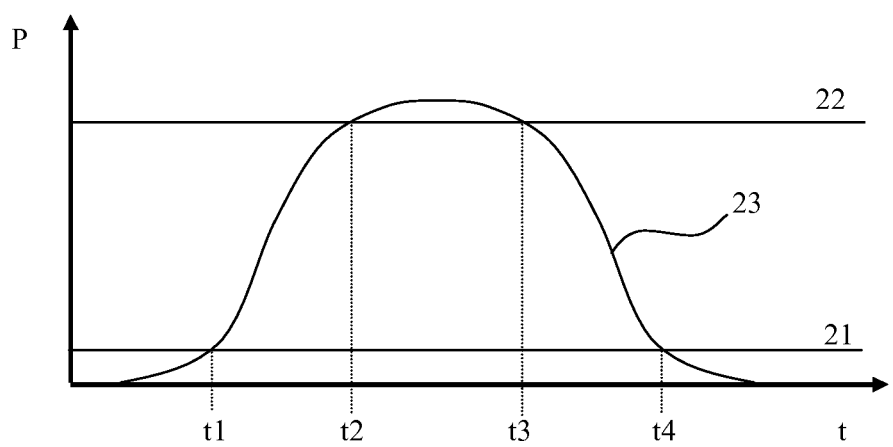
FIG. 2 shows an example of produced power as a function of time.

An exemplary embodiment of the present disclosure is further explained with reference to FIG. 2. FIG. 2 shows an example of power as a function of time during one day period. In the morning, the sun rises and the solar panel 1 starts producing power. The produced power 23 is below the consumption of the converter itself (line 21) at the beginning, and power is used to heat the container structure. At time instant t1, produced power 23 exceeds the power consumed by the converter 2, and the converter 2 can be started. In the example of FIG. 2, the solar panels are overrated, and at time instant t2, the produced power exceeds the capacity of the converter (line 22). The excessive power can be used for heating, cooling or drying. After time instant t3, power output from the panels 1 decreases, and once it goes below line 21, the converter 2 is stopped. The remaining power from the panels 1 is used for heating thermal masses, as explained above. It should be noted that FIG. 2 is an example for clarifying the operation and it is not based on any measurement or simulations.

Exemplary embodiments of the present disclosure have been described above in connection with solar power, where the container incorporates the power electronic devices required for extracting the power from the panel and converts the obtained power for feeding it to a grid. The term "container" should be understood broadly, meaning a kiosk, building, closet or similar structure that is at least mainly intended to accommodate the power electronics of a solar power system.

It will be obvious to a person skilled in the art that the inventive concept can be implemented in various ways. The disclosure and its embodiments are not limited to the examples described above but may vary within the scope of the claims.

Thus, it will be appreciated by those skilled in the art that the present invention can be embodied in other specific forms without departing from the spirit or essential characteristics thereof. The presently disclosed embodiments are therefore considered in all respects to be illustrative and not restricted. The scope of the invention is indicated by the appended claims rather than the foregoing description and all changes that come within the meaning and range and equivalence thereof are intended to be embraced therein.

What is claimed is:

1. A method in connection with a solar energy system which includes solar panels and a converter for converting DC voltage from the solar panels, the converter being arranged inside a container, the method comprising:
   converting, by the converter, the DC voltage from the solar panels to AC voltage to supply the AC voltage to an electrical distribution network; and
   producing heat inside the container with a resistive element supplied by the solar panels while a measured power produced by the solar panels is below a sufficient level for feeding power through the converter to the electrical distribution network, and
   cooling air inside the container with a cooling arrangement supplied by excess energy of the solar panels, when the power output from the solar panels exceeds a power rating of the converter.

2. A method according to claim 1, comprising:
   operating the resistive element for producing heat when the converter is not in operation.

3. A method according to claim 1, wherein the air inside the container is dried when the power output from the solar panels exceeds the power rating of the converter.

4. A method according to claim 1, wherein the resistive element includes at least two resistors, and wherein the step of producing heat comprises:
producing heat with at least one of the resistors arranged inside the container when solar power is available prior to the start of the converter; and
producing heat with at least one of the resistors arranged to heat a thermal mass inside the container when solar power is available after the use of the converter.

5. A method according to claim 4, comprising:
measuring power fed by the solar panels to the resistors prior to the start of the converter; and
determining from the measured power whether the converter can be started.

6. A method according to claim 5, wherein the step of determining comprises:
filtering or averaging the measured power; and
determining from the filtered or averaged power whether the converter can be started.

7. A method according to claim 1, comprising:
operating the resistive element for producing the heat when power from the solar panels exceeds the power rating of the converter.

8. A method according to claim 1, wherein the solar energy system comprises a drying arrangement configured to be operated when the power output from the solar panels exceeds the power rating of the converter.

9. A method according to claim 1, wherein the resistive element for producing heat comprises at least one resistor.

10. A method according to claim 1, wherein the resistive element for producing heat comprises at least two resistors, at least one of the resistors being configured to heat inside air of the container, and at least another one of the resistors being configured to heat a thermal mass inside the container.

11. A method according to claim 10, comprising:
leading, by a change-over switch, the power from the solar panels either to at least one of the resistors configured to heat the inside air or to at least one of the resistors configured to heat the thermal mass.

12. A method according to claim 10, wherein the at least one of the resistors configured to heat the inside air of the container is configured to be used before an operation of the converter is started.

13. A method according to claim 10, wherein the at least one of the resistors configured to heat the thermal mass is configured to be used after an operation of the converter has been stopped.

14. A method according to claim 1, comprising:
measuring power fed to the resistive element for producing heat; and
adapting starting of the operation of the converter based on the measured power.

15. A method according to claim 14, wherein the measured power is one of an average value and a filtered value of the power.

16. A method according to claim 14, wherein the heat is produced when the power from the solar panels exceeds the power rating of the converter.

17. A method according to claim 16, wherein the resistive element includes at least two resistors, and
wherein the step of producing heat comprises:
producing heat with at least one of the resistors arranged inside the container when solar power is available prior to the start of the converter; and
producing heat with at least one of the resistors arranged to heat thermal mass inside the container when solar power is available after the use of the converter.

18. A method according to claim 17, comprising:
measuring power fed by the solar panels to the resistors prior to the start of the converter; and
determining from the measured power whether the converter can be started.

19. A method according to claim 18, wherein the determining of whether the converter can be started comprises:
filtering or averaging the measured power; and
determining from the filtered or averaged power whether the converter can be started.

* * * * *